United States Patent
Kato

(10) Patent No.: US 10,340,106 B2
(45) Date of Patent: Jul. 2, 2019

(54) LOAD DRIVER

(71) Applicant: DENSO CORPORATION, Kariya, Aichi-pref. (JP)

(72) Inventor: Hirotsugu Kato, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/826,782

(22) Filed: Nov. 30, 2017

(65) Prior Publication Data

US 2018/0182583 A1 Jun. 28, 2018

(30) Foreign Application Priority Data

Dec. 26, 2016 (JP) .................................. 2016-251787

(51) Int. Cl.
| | |
|---|---|
| *B60T 13/74* | (2006.01) |
| *H01H 47/22* | (2006.01) |
| *H01H 47/00* | (2006.01) |
| *H03K 17/567* | (2006.01) |
| *H02P 31/00* | (2006.01) |

(52) U.S. Cl.
CPC ............. *H01H 47/22* (2013.01); *B60T 13/74* (2013.01); *H01H 47/001* (2013.01); *H03K 17/567* (2013.01); *H02P 31/00* (2013.01)

(58) Field of Classification Search
CPC ....... F16H 61/00; F16H 61/0006; B60T 13/74
See application file for complete search history.

(56) References Cited

U.S. PATENT DOCUMENTS

| 2,728,865 | A | * | 12/1955 | Day | .................. H02J 9/066 |
| | | | | | 307/64 |
| 5,487,278 | A | * | 1/1996 | Hilleveld | .......... B60H 1/00428 |
| | | | | | 62/230 |
| 6,330,176 | B1 | * | 12/2001 | Thrap | .................... H02J 3/005 |
| | | | | | 307/86 |
| 2006/0158039 | A1 | | 7/2006 | Kawamura | |

FOREIGN PATENT DOCUMENTS

| JP | 2002-075622 A | 3/2002 |
| JP | 2006-197276 A | 7/2006 |
| JP | 2011-092396 A | 5/2011 |

* cited by examiner

*Primary Examiner* — Bentsu Ro
(74) *Attorney, Agent, or Firm* — Posz Law Group, PLC

(57) ABSTRACT

A load driver includes a microcomputer controlling an ON-OFF switching of a first relay and a second relay. The load driver also includes a fourth switching element performing an ON-OFF drive of the first relay based on a drive signal from the microcomputer, and a fifth switching element performing an ON-OFF drive of the second relay based on a permission signal from the microcomputer. The load driver further includes a third switching element prohibiting the ON drive of the second relay by the fifth switching element to power a motor with power from an accessory battery via the first relay when the microcomputer outputs a "Lo" drive signal.

11 Claims, 4 Drawing Sheets

LOAD DRIVER

CROSS REFERENCE TO RELATED APPLICATION

The present application is based on and claims the benefit of priority of Japanese Patent Application No. 2016-251787, filed on Dec. 26, 2016, the disclosure of which is incorporated herein by reference.

TECHNICAL FIELD

The present disclosure generally relates to a load driver that supplies electric power to a load via a plurality of relays.

BACKGROUND INFORMATION

Japanese Patent Laid-Open No. 2006-197276 discloses a simultaneous-ON prevention circuit that prevents the switching ON of a plurality of relays at the same time.

The simultaneous-ON prevention circuit includes a first transistor connected to a first semiconductor relay via a first diode and controlled by a controller. The circuit also includes a second transistor connected to a second semiconductor relay via a second diode and controlled by the controller. A first resistor is interposed between the first semiconductor relay and the power supply, and a second resistor is interposed between the second semiconductor relay and the power supply. The simultaneous-ON prevention circuit includes a third diode connected at two positions, that is, at a position between the second resistor and the second semiconductor relay and at a position between the first diode and the first transistor. The circuit further includes fourth diode connected at two positions, that is, at a position between the first resistor and the first semiconductor relay and at a position between the second diode and the second transistor.

In such manner, the simultaneous-ON prevention circuit is configured to so ground the upstream portion(s) of the semiconductor relay(s) using the third diode and/or the fourth diode even when both transistors are simultaneously turned ON, for example, due to a controller malfunction. Therefore, the simultaneous-ON prevention circuit keeps an OFF state of the semiconductor relay, and prevents a simultaneous ON of the plurality of relays.

However, the simultaneous-ON prevention circuit includes the third diode connected to an upstream portion of the second semiconductor relay and the fourth diode connected to an upstream portion of the first semiconductor relay. Therefore, the simultaneous-ON prevention circuit needs to have additional ports to connect external connections to the upstream portions of each of the semiconductor relays to the third and fourth diodes, respectively, as well as having to have an increased number of wire harnesses.

SUMMARY

It is an object of the present disclosure to provide a load driver that limits and/or prevents an increase of the number of ports and an increase of the number of wire harnesses.

In an aspect of the present disclosure, the load driver for driving a load is configured to receive a supply of electric power from a first power supply or from a second power supply. The load driver has a first relay disposed at a position between the first power supply and the load and a second relay disposed at a position between the second power supply and the load. The load driver further includes: a controller configured to control an open state and a closed state of the first relay and the second relay by an open-close control signal and a first open-close switch configured to control driving the first relay to the open state and the closed state based on the open-close control signal from the controller. The load driver also includes a second open-close switch configured to control driving the second relay to the open state and the closed state based on the open-close control signal from the controller. The load driver includes a prohibition switch configured to prohibit driving the second relay to the closed state, when the controller outputs the open-close control signal to drive the first relay to the closed state to supply electric power from the first power supply to the load via the first relay.

As described above, the load driver of the present disclosure includes a prohibition switch that prohibits driving the second relay to the closed state when an open-close control signal that instructs a closed state of the first relay is being output, thereby preventing a simultaneous closed state of both of the first relay and the second relay. The load driver of the present disclosure prevents the simultaneous closed state of both of the first relay and the second relay without having a diode that is connected to an upstream portion of the first and second relays, thereby limiting and/or preventing an increase of the number of ports and an increase of the number of wire harnesses.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
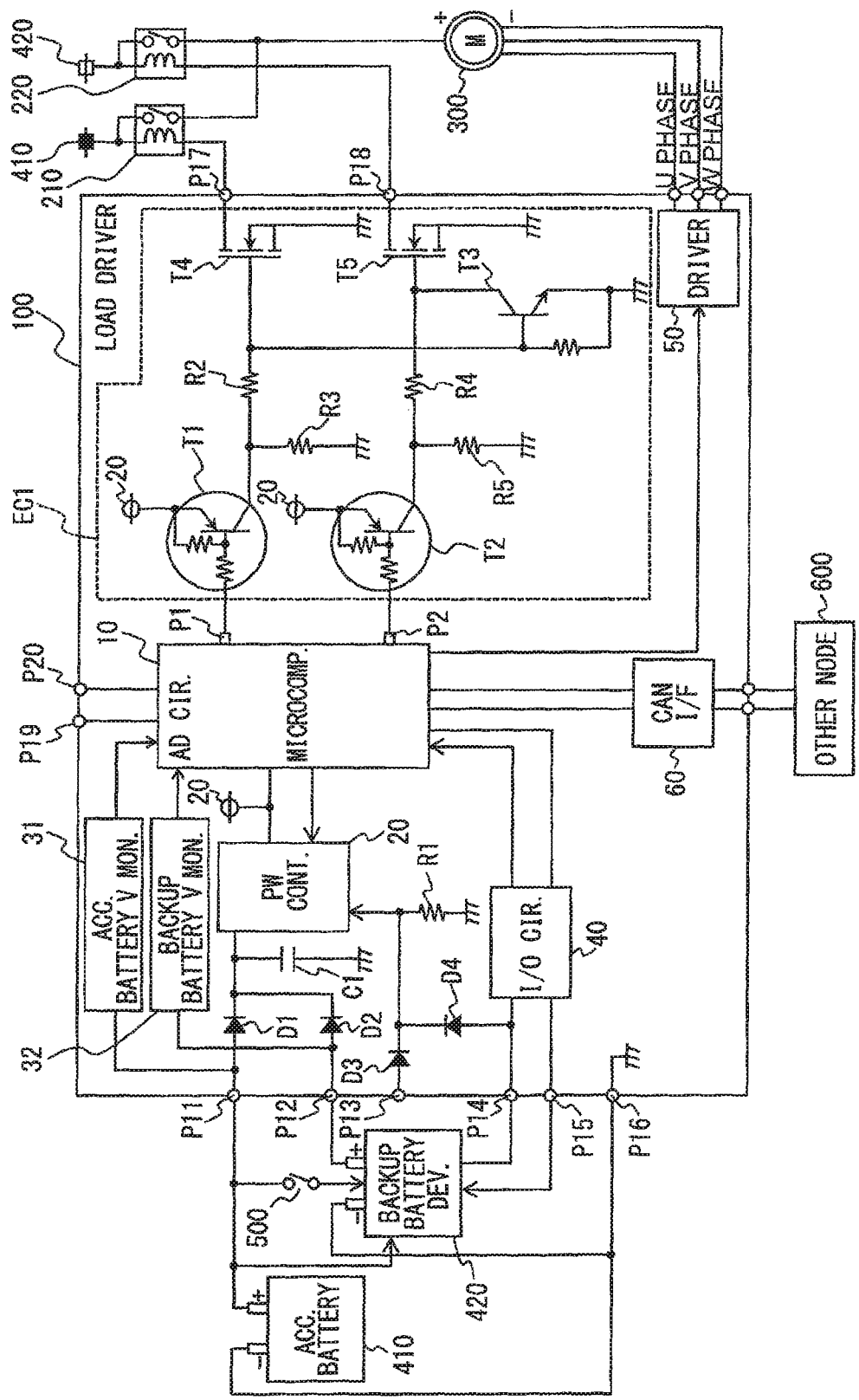
FIG. 1 illustrates a configuration diagram of a load driver.

An embodiment of the present disclosure is described with reference to the drawings. With reference to FIG. 1, a load driver 100 which drives a motor (i.e., load) 300 is described. More practically, the motor 300 may be an electromotor used to drive the parking lock of a vehicle. Therefore, the load driver 100 is configured to be installable in a vehicle.

As described later in detail, as for the load driver 100, two batteries 410 and 420 are connected with one motor 300. A system including the load driver 100, the motor 300, and two batteries 410 and 420 may be described as a load drive system. The motor 300 is configured to receive a supply of electric power from the two batteries 410 and 420. In other words, the two batteries 410 and 420 serve as a power supply to the motor 300. Thus, the load drive system is configured to supply electric power from one of the two batteries 410 and 420 to the motor 300. In other words, the load driver 100 is capable of supplying electric power from either one of the two batteries 410 or 420 to the motor 300.

However, the present disclosure is not limited to the configuration described above. That is, a different load other than the motor 300 may be driven by the load driver of the present disclosure. For example, a vehicle to which the present disclosure is applicable may be a hybrid vehicle, in which a drive power supply (i.e., motive power) comprises an engine and a motor-generator, and a battery is used to store electric power for driving the motor-generator. The vehicle to which the present disclosure is applicable may also be a vehicle other than a hybrid vehicle.

The configuration of the load driver 100 is described, with reference to FIG. 1. The load driver 100 is provided with a plurality of circuit elements, in addition to a microcomputer 10, a power controller 20, an accessory battery voltage monitor 31, a backup battery voltage monitor 32, an input-output circuit 40, and a driver 50. As the plurality of circuit elements, the load driver 100 is provided with a capacitor C1, a first diode D1 to a fourth diode D4 (i.e., D1, D2, D3, D4), a first switching element T1 to a fifth switching element T5 (i.e., T1, T2, T3, T4, T5), a first resistor R1 to a fifth resistor R5 (i.e., R1, R2, R3, R4, R5). The microcomputer 10 and the power controller 20 may be referred to as a controller. From among the plurality of circuit components, the second resistor R2 to the fifth resistor R5 and the first switching element T1 to the fifth switching element T5 may form an electric circuit part EC1.

In the present embodiment, the load driver 100 is described as having a CAN interface 60 that may serve as a communication interface. However, the load driver 100 may not be provided with the CAN interface 60. In FIG. 1, the CAN interface is indicated as CAN I/F. CAN is an abbreviation for Controller Area Network. CAN is a registered trademark.

The load driver 100 is provided with a terminal (i.e., a port) for an electric connection with an external device. More practically, the load driver 100 includes: a first power supply terminal P11; a second power supply terminal P12; an ignition terminal P13; a first communication terminal P14; a second communication terminal P15; a ground terminal P16; a first relay terminal P17; a second relay terminal P18; a lock terminal P19; and a shift terminal P20. As used herein, an electric connection may simply be described as a "connection".

The load driver 100 is configured to include a first relay 210, a second relay 220, the motor 300, an accessory battery 410, a backup battery device 420, and another node 600, which may be connected to the terminals described above. The load driver 100 is configured to receive a voltage from the ignition terminal P13 when the ignition switch is turned OFF and ON. In the load driver 100, when the voltage from turning ON the ignition switch is applied to the ignition terminal P13, a start signal is input to the power controller 20, and, when the ignition terminal P13 receives a voltage (or lack thereof) from turning OFF of the ignition switch, the input of the start signal to the power controller 20 is stopped.

Figure 3:
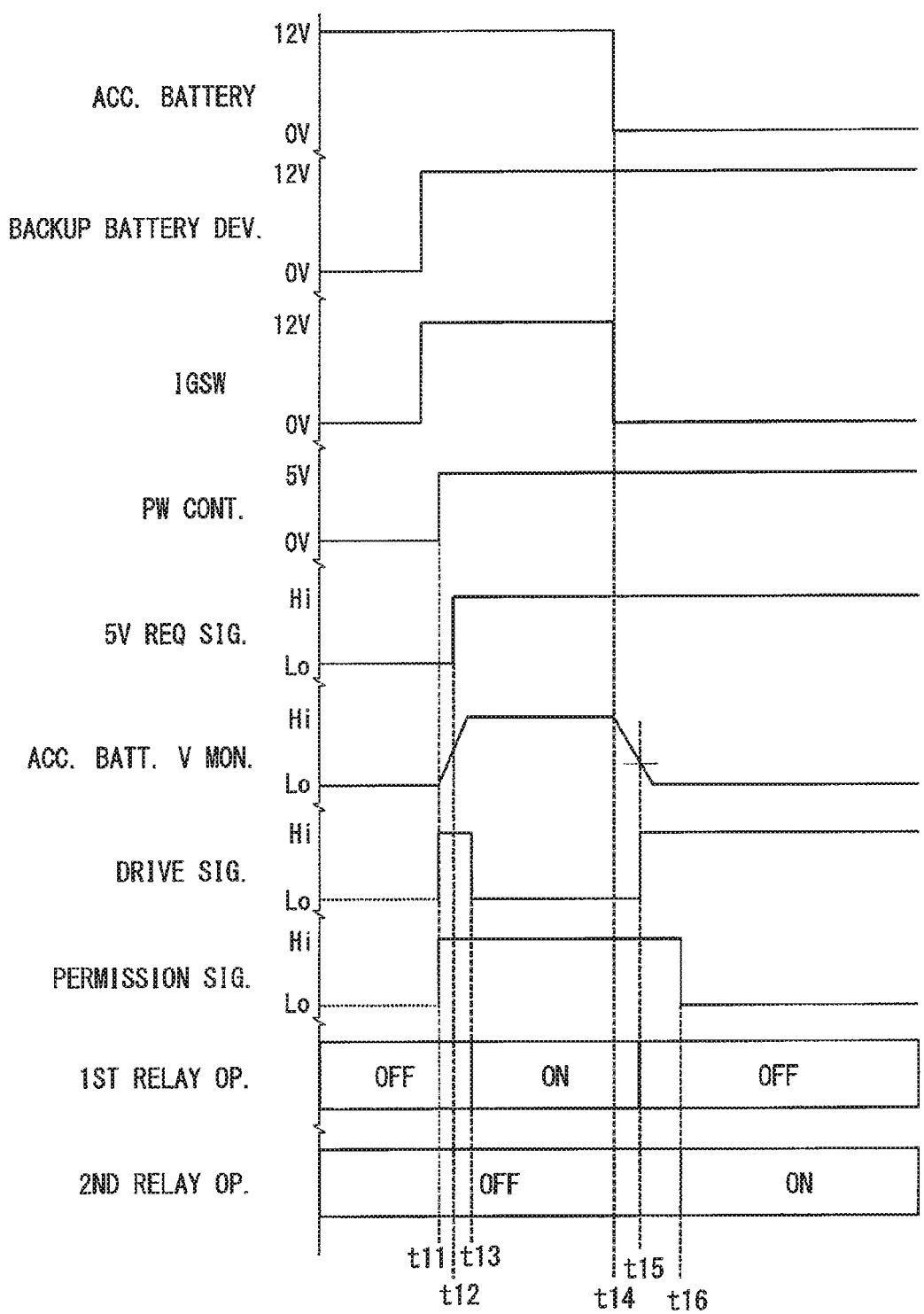
FIG. 3 is a time chart of a process operation of the load driver.
Figure 4:
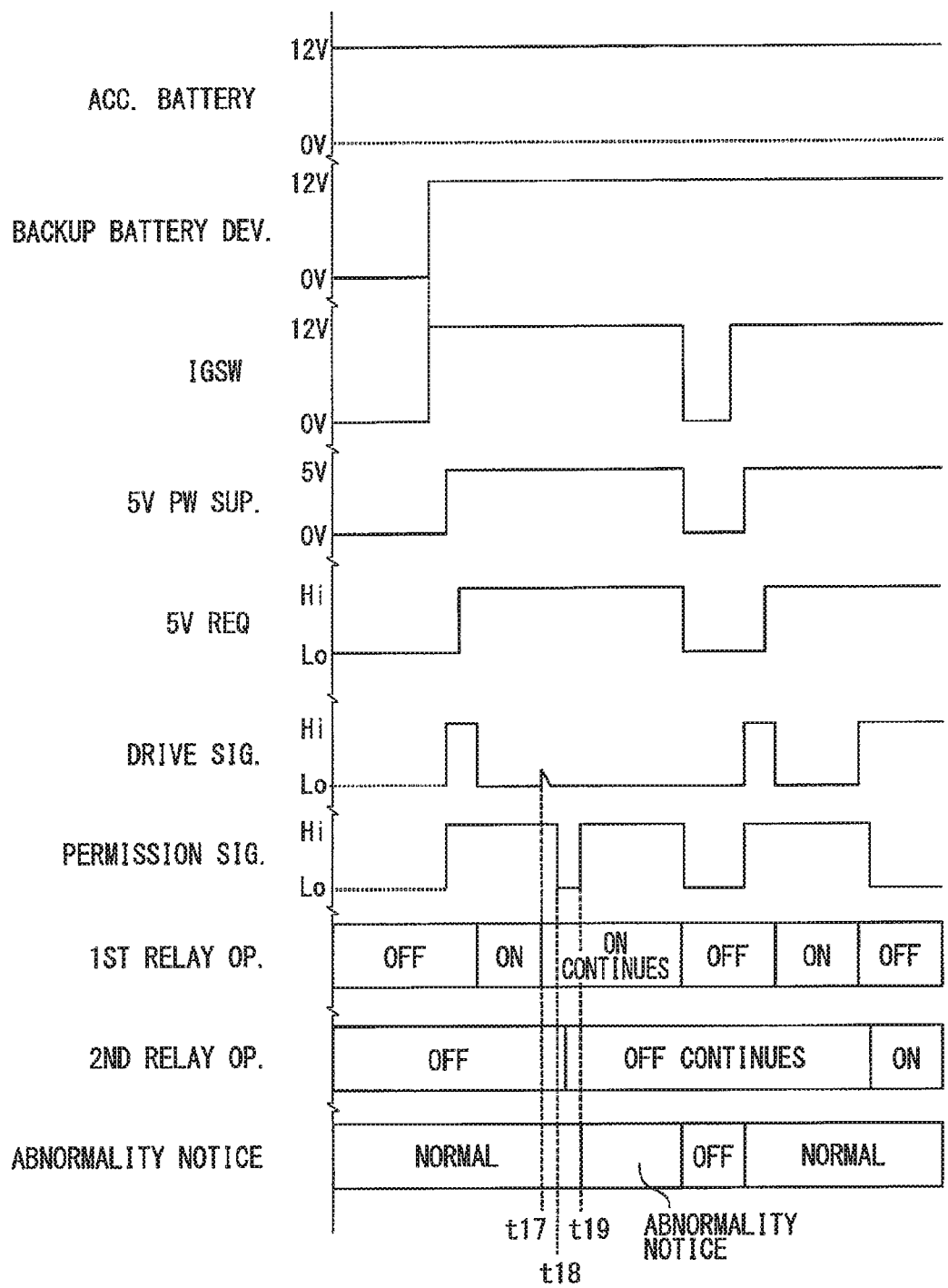
FIG. 4 is a time chart of a process operation of the load driver.

IG is an abbreviation for an "ignition". IGSW in FIG. 3 and FIG. 4 is an abbreviation for an "ignition switch". The start signal is a signal that starts the microcomputer 10 and the power controller 20 from a stop state, i.e., a state to which no electric power is currently supplied. The start signal is not limited to a signal that depends on the IGSW.

The first relay 210 and the second relay 220 are driven by the load driver 100. That is, the load driver 100 turns ON and turns OFF the first relay 210 and the second relay 220 individually. The first relay 210 is connected to the first relay terminal P17 via a wire harness or like connection. Further, the first relay 210 is connected in series to a position between the accessory battery 410 and the motor 300, and the first relay 210 serves as a switch for switching a supply of electric power from the accessory battery 410 to the motor 300. ON corresponds to a closed state of a switch. OFF corresponds to an open state of a switch. Therefore, turning ON and OFF corresponds to the closing and the opening of a switch.

On the other hand, the second relay 220 is connected to the second relay terminal P18 via a wire harness or like connection. The second relay 220 is connected in series to a position between the backup battery device 420 and the motor 300. The second relay 220 serves as a switch for switching the supply of electric power from the backup battery device 420 to the motor 300.

The motor 300 corresponds to a "load", and may be an actuator of a parking lock mechanism. That is, the motor 300 may be an electromotor for switching a parking lock mechanism between a lock state and an unlock state. The motor 300 may be implemented as an electromotor operated by a three-phase alternating current electric power. The motor 300 receives a supply of electric power from the accessory battery 410 or from the backup battery device 420 via a U phase terminal, a V phase terminal, and a W phase terminal of the load driver 100.

The accessory battery 410 is a battery or a first power supply, and performs a supply of electric power (e.g., 12V) to the load driver 100 and to other accessories of the vehicle. The accessory battery 410 is configured to supply electric power to the motor 300, as described above. The accessory battery 410 has a "+" terminal (i.e., a plus or positive terminal) connected to the first power supply terminal P11, and a "−" terminal (i.e., a negative or minus terminal) connected to the ground terminal P16. The accessory battery 410 may be configured to always supply electric power to the load driver 100. The accessory battery 410 may be considered as a main battery of the load driver 100.

The backup battery device 420 is a battery or a second power supply configured to supply electric power (e.g., 12V) to the load driver 100 and to the motor 300. Unlike the accessory battery 410, the backup battery device 420 is not configured to supply electric power to a device other than the load driver 100 and the motor 300. The backup battery device 420 may be a dedicated device that is exclusively provided for the load driver 100 and the motor 300. That is, the backup battery device 420 may be considered a dedicated battery for the load drive system including the load driver 100 and the motor 300. However, the backup battery device 420 may not be provided exclusively for the load drive system and may be used to provide backup electric power to other devices as well.

Unlike the accessory battery 410, the backup battery device 420 does not always supply electric power to the load driver 100. The backup battery device 420, when used in place of the accessory battery 410, supplies electric power to the load driver 100 and the motor 300, when the supply of electric power by the accessory battery 410 is not available. Therefore, the load driver 100 is configured to have a redundant power supply to prevent the loss of electric power. The load driver 100 has a preventive configuration so that power may continue being supplied to the motor 300, thereby limiting and/or preventing the loss of power supply to the motor 300. As used herein, when a supply of electric power can be normally performed, the electric power supply is designated as being in a normal state. When a supply of electric power may not be performed normally, the electric power supply is designated as being in an abnormal state or as an abnormality. The abnormal state may also be designated as loss of power supply function.

As for the backup battery device 420, the + (plus) terminal is connected to the second power supply terminal P12, and the − (minus) terminal is connected to the ground terminal P16. The backup battery device 420 is connected to the first communication terminal P14 and to the second communication terminal P15. The backup battery device 420 is further connected to a wiring that connects the + terminal of the accessory battery 410 and the first power supply terminal P11 via a switch 500, and is chargeable by receiving electric power from the accessory battery 410.

Unlike the accessory battery 410, the backup battery device 420 is provided with a processing part, a storage part, and the like, in addition to the battery part. Therefore, the backup battery device 420 may also be designated as a backup battery assembly (i.e., "ASSY"). Thus, the backup battery device 420 may be configured to monitor a voltage of the accessory battery 410. The backup battery device 420 may also be configured to perform two-way communication with the load driver 100, via the first communication terminal P14 and the second communication terminal P15.

The backup battery device 420 transmits data/messages to the load driver 100 regarding: whether the backup battery device 420 is charging; whether an electric power may be supplied to the load driver 100; (iii) a voltage value of the backup battery device 420; and (iv) a start signal to the power controller 20. The communication between the load driver 100 and the backup battery device 420 may also be designated as battery communication.

The backup battery device 420 is, for example, configured to control the ON and OFF switching of the switch 500. The switch 500 is a normally-OFF switch. The backup battery device 420 switches the switch 500 from OFF to ON, when (i) the backup battery device 420 charges itself and (ii) the accessory battery 410 is capable of supplying electric power for charging the backup battery device 420. The switch 500 may be a built-in component of the backup battery device 420.

Thus, the backup battery device 420 may also be described as having a communication function, a voltage monitor function, a switch control function, and the like. Just like the backup battery device 420, the accessory battery 410 may be provided with a processing part and a storage part, and may be configured to perform communication with the load driver 100.

The other node 600 may be implemented as a notification device such as a display device, or a sound output device disposed in a vehicle compartment The other node 600 is connected to a communication terminal of the load driver 100.

The microcomputer 10 is connected with the power controller 20, the accessory battery voltage monitor 31, the backup battery voltage monitor 32, the input-output circuit 40, the driver 50, and the CAN interface 60. The microcomputer 10 is also connected with the first switching element T1, the second switching element T2, the lock terminal P19, and the shift terminal P20. The microcomputer 10 receives a supply of electric power (e.g., 5V) generated by the power controller 20. Note that the supply of electric power generated by the power controller 20 is an electric power used within the load driver 100, and may also be designated as an internal electric power.

The microcomputer 10 is provided with an arithmetic processor, a storage medium for storing one or more programs and data together with other components. The storage medium non-temporarily stores a program that can be read by the arithmetic processor. That is, the storage medium may be a non-transitory or substantially permanent storage medium for storing a program that can be executed by the processor. The storage medium also stores the data that is readable and writable by the arithmetic processor. The storage medium may be implemented as a semiconductor memory or a magnetic disk. The microcomputer 10 performs a process, for example, by executing the program and referencing the data using the arithmetic processor. The microcomputer 10 may control the ON and OFF switching of the first relay 210 and the second relay 220.

The microcomputer 10 is provided with an analog-digital conversion circuit (i.e., an "AD circuit"). The microcomputer 10 is also configured to be capable of obtaining a timer value to measure time.

When the microcomputer 10 is not in a power receiving state (i.e., not receiving power from the power supply), the microcomputer 10 waits to receive a power. The ignition switch IGSW is first turned ON and a voltage is then provided to the ignition terminal P13. The power controller 20 receives the start signal from ignition terminal P13 and the microcomputer 10 starts to operate by receiving a supply of an internal electric power from the power controller 20. When the microcomputer 10 is started, the microcomputer 10 transmits a signal to the power controller 20 to maintain the supply of the internal electric power to the microcomputer 10. By transmitting such a signal, the microcomputer 10 can maintain a supply of the internal electric power to the microcomputer 10. Such signal may also be designated as a 5V request signal or a maintain signal.

As for the microcomputer 10, a base terminal of the first switching element T1 is connected to a drive signal terminal P1 of the microcomputer 10, and a base terminal of the second switching element T2 is connected to a permission signal terminal P2 of the microcomputer 10. In the present embodiment, a PNP transistor is adopted as the first switching element T1 and the second switching element T2.

The microcomputer 10 is configured to output either a Lo drive signal or a Hi drive signal from the drive signal terminal P1. The microcomputer 10 is also configured to output a Lo permission signal or a Hi permission signal from the permission signal terminal P2. In the present embodiment, an NPN transistor is adopted as the third switching element T3, and a MOSFET, or a Metal-Oxide Semiconductor Field Effect Transistor, is adopted as the fourth switching element T4 and the fifth switching element T5. However, each of those switching elements T1-T5 is not necessarily limited to such devices.

The drive signal is an open-close control signal that instructs the first relay 210 to open or close. The Lo drive signal is a signal instructing the first relay 210 to close and turn ON. The Hi drive signal is a signal instructing the first relay 210 to open and turn OFF. The permission signal is an open-close control signal that instructs the second relay 220 to open or close. The Lo permission signal is a signal instructing the second relay 220 to close and turn ON. The Hi permission signal is a signal that instructs the second relay 220 to open and turn OFF.

The fourth switching element T4 corresponds to a first open-close switch. The fifth switching element T5 corresponds to a second open-close switch. The third switching element T3 corresponds to a prohibition switch.

A lock instruction signal is input to the microcomputer 10 from the lock terminal P19 that indicates a lock state of the parking lock mechanism. The lock instruction signal is output by a parking switch or the like being operated by the user of the vehicle.

A shift change signal is input to the microcomputer 10 from the shift terminal P20 to indicate a shift change. The signals which instruct a shift change may be, for example, an R range signal that indicates a shift change to an R range, a D range signal that indicates a shift change to a D range, and the like. The R range signal and the D range signal are output by a shifter or the like being operated by the user. The R range signal and the D range signal also function as a lock release signal by which the lock state of the parking lock mechanism is released. That is, the lock release signal is a signal indicating the unlock state.

When a lock instruction signal is input, the microcomputer 10 drives the motor 300 to put the parking lock mechanism into the lock state, for immobilizing the vehicle, i.e., for putting the vehicle in a parked, immovable state. When a lock release signal is input during the lock state of the parking lock mechanism, the microcomputer 10 drives the motor 300 to release the lock state of the parking lock mechanism, to put the vehicle in a travelable state. The load driver 100 may also be a shift-by-wire control device, and a load drive system may also be a shift-by-wire system.

In the present embodiment, the R range signal and the D range signal are described as example lock release signals. However, the lock release signal is not limited to those signals.

The power controller 20 is connected to the first power supply terminal P11 via the first diode D1, and is connected to the second power supply terminal P12 via the second diode D2. The power controller 20 is configured to connect to the accessory battery 410 or to the backup battery device 420. That is, the power controller 20 can receive a supply of electric power from the accessory battery 410 via the first diode D1, and can receive a supply of electric power from the backup battery device 420 via the second diode D2. The power controller 20 generates an internal electric power based on the supply of electric power supplied from the accessory battery 410 or the backup battery device 420.

Thereby, even when the accessory battery 410 is in an abnormal state, the microcomputer 10 can operate itself (i.e., continue operation) by receiving a supply of electric power from the backup battery device 420 via the second diode D2, i.e., without supply loss of power. That is, even when the accessory battery 410 is in an abnormal state, the load driver 100 can receive the internal electric power from the backup battery device 420 via the second diode D2.

The first diode D1 has its anode connected to the first power supply terminal P11, and has its cathode connected to the power controller 20. The second diode D2 has its anode connected to the second power supply terminal P12, and has its cathode connected to the power controller 20. One end of the capacitor C1 is connected to the wiring that connects the cathodes of the diodes D1, D2 and the power controller 20. The other end of the capacitor C1 is connected to ground.

The power controller 20 is connected to the ground via the first resistor R1. The power controller 20 is connected to the ignition terminal P13 via the third diode D3 and to the first communication terminal P14 via the fourth diode D4 by way of wiring to the first resistor R1. The third diode D3 has its anode connected to the ignition terminal P13, and has its cathode connected to the power controller 20. The fourth diode D4 has its anode connected to the first communication terminal P14 and has its cathode connected to the power controller 20. The power controller 20 is configured to receive an input of a start signal via the third diode D3 and to receive an input of a start signal via the fourth diode D4.

The power controller 20 is configured to supply the internal electric power to the microcomputer 10 or the like, when the power controller 20 receives the start signal when the ignition switch IGSW is turned ON. The power controller 20 is also configured to supply the internal electric power to the microcomputer 10 or the like, not only when a start signal is input when the ignition switch IGSW is turned ON, but also when the power controller 20 receives a start signal from the backup battery device 420. Therefore, even when there is a loss of internal electric power, the load driver 100 is configured to be restarted by the start signal from the backup battery device 420.

The accessory battery voltage monitor 31 (also referred to herein as a first monitor 31) monitors the voltage of the accessory battery 410, and outputs the voltage of the accessory battery 410 to the microcomputer 10. The first monitor 31 is connected to the wiring between the first power supply terminal P11 and the anode of the first diode D1, and to the AD circuit of the microcomputer 10. The backup battery voltage monitor 32 (also referred to herein as a second monitor 32) monitors the voltage of the backup battery device 420, and outputs the voltage of the backup battery device 420 to the microcomputer 10. The second monitor 32 is connected to the wiring between the second power supply terminal P12 and the anode of the second diode D2, and to the AD circuit of the microcomputer 10.

The microcomputer 10 can monitor the voltage of the backup battery device 420 by receiving the backup battery voltage from the second monitor 32 while also monitoring the voltage of the accessory battery 410 by receiving the accessory battery voltage from the first monitor 31. For example, when the accessory battery voltage from the first monitor 31 reaches a threshold value (i.e., when the voltage from the first monitor 31 falls below a threshold value), the microcomputer 10 determines that there is an abnormality or an abnormal state. Again, the microcomputer 10 determines whether the electric power supply function of the accessory battery 410 is lost or not. The first monitor 31 corresponds to a monitor circuit.

The threshold in this case may be 0.1 V, for example, which is a voltage value that may be observed when the accessory battery 410 is lost. For example, the accessory battery 410 may be unwired or a connector connecting the accessory battery 410 and the load driver 100 may be disconnected. The microcomputer 10 can determine an abnormal state of the backup battery device 420 in the same manner as the abnormal state of the accessory battery 410.

Since the microcomputer 10 monitors the voltage by using the AD circuit, the microcomputer 10 can detect the loss of function for each of the batteries 410 and 420, and can immediately determine that the batteries 410 and 420 are in an abnormal state. That is, the microcomputer 10 can determine an abnormal state of each of the batteries 410 and 420 earlier and quicker than a configuration in which the monitor result is obtained as a digital value. Again, the microcomputer 10 can immediately, determine whether each of the batteries 410 and 420 is in a normal state or not. The microcomputer 10 can improve the reliability of determining whether each of the batteries 410 and 420 is in a normal state by basing such determination on an analog value to guard against changes, variations, and fluctuations of digital values caused by noise and like interference.

The input-output circuit 40 is connected to the first communication terminal P14, the second communication terminal P15, and the microcomputer 10. The input-output circuit 40 is a communication interface between the backup battery device 420 and the microcomputer 10. Two-way communication can be made between the microcomputer 10 and the backup battery device 420 via the input-output circuit 40. For example, the microcomputer 10 may transmit a request for a supply of electric power to the backup battery device 420. Since the microcomputer 10 can communicate with the backup battery device 420, the microcomputer 10 is enabled to check whether the backup battery device 420 is charging or not, and to monitor the voltage of the backup battery device 420.

The driver 50 generates the drive signal which drives the motor 300 based on the signal output from the microcomputer 10. Then, the driver 50 outputs, respectively from a U phase terminal, a V phase terminal and a W phase terminal, a U phase drive signal, a V phase drive signal and a W phase drive signal. That is, the microcomputer 10 drives the motor 300 by using the driver 50.

The CAN interface 60 is a communication interface for the microcomputer 10 to communicate with the other node 600 based on a CAN protocol. In the present embodiment, the CAN interface 60 is adopted as an example of a communication interface. However, the load driver 100 is not limited to such configuration, that is, the load driver 100 may have any other communication interface configuration as long as the configuration allows for communication between the driver 100 and the other node 600.

The electric circuit part EC1 is the circuit between the microcomputer 10 and the first relay terminal P17 and the circuit configuration between the microcomputer 10 and the second relay terminal P18. According to the present embodiment, the circuit configuration for the electric circuit part EC1 described herein is adopted as an example, but the circuit configuration is not limited to the one described herein.

The first switching element T1 has its base terminal connected to the drive signal terminal P1, and has its emitter terminal connected to the power controller 20. The first switching element T1 has its collector terminal connected to the ground via the third resistor R3, and also connected to the gate of the fourth switching element T4 via the second resistor R2.

The second switching element T2 has its base terminal connected to the permission signal terminal P2, and has its emitter terminal connected to the power controller 20. The second switching element T2 has its collector terminal connected to the ground via the fifth resistor R5, and also connected to the gate of the fifth switching element T5 via the fourth resistor R4.

The fourth switching element T4 has its drain terminal connected to the first relay terminal P17, and has its source terminal connected to the ground. The fourth switching element T4 performs an ON-OFF drive of the first relay 210 based on the open-close control signal from the microcomputer 10 that instructs the fourth switching element T4 turn ON and OFF the first relay 210.

The fifth switching element T5 has its drain terminal connected to the second relay terminal P18, and has its source terminal connected to the ground. The fifth switching element T5 performs the ON-OFF drive of the second relay 220 based on the open-close control signal from the microcomputer 10 that instructs the fifth switching element T5 to turn ON and OFF the second relay 220.

The third switching element T3 is connected to a position between the second resistor R2 and the gate of the fourth switching element T4, and also to a position between the fourth resistor R4 and the gate of the fifth switching element T5. The third switching element T3 has its base terminal connected to a position between the second resistor R2 and the gate of the fourth switching element T4, and has its collector terminal connected to a position between the fourth resistor R4 and the gate of the fifth switching element T5. The third switching element T3 has its emitter terminal connected to the ground.

When a Lo drive signal is output from the microcomputer 10 to supply electric power from the accessory battery 410 via the first relay 210 to the motor 300, the third switching element T3 prohibits the ON drive of the second relay 220 by the fifth switching element T5. More practically, when the LO drive signal is output from the microcomputer 10, the third switching element T3 will ground the potential of the gate terminal of the fifth switching element T5, and will limit and/or prohibit the ON drive of the second relay 220 by the fifth switching element T5. In such manner, the load driver 100 is configured to ground the gate potential of the fifth switching element T5 (MOSFET) by using the third switching element T3 (transistor), to stop an operation of the fifth switching element T5.

Figure 2:
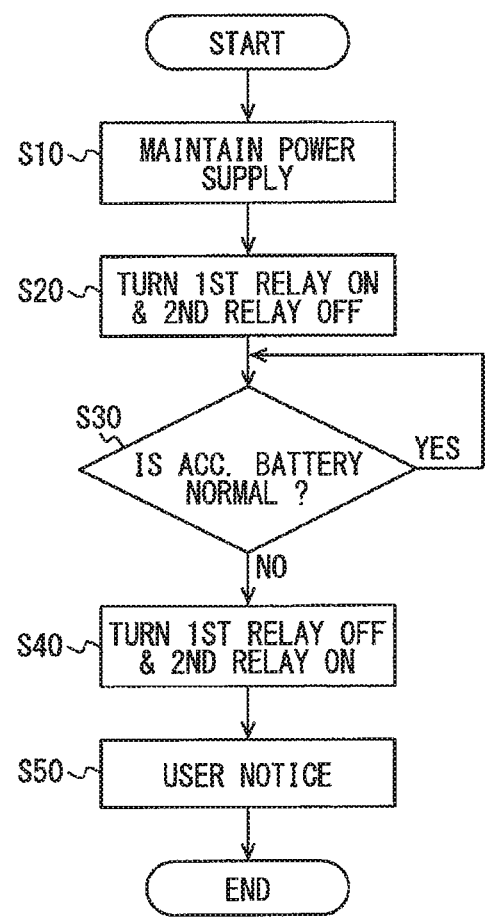
FIG. 2 is a flowchart of a process operation of the load driver.

The operation of the load driver 100 is described, with reference to FIG. 2 and FIG. 3.

The microcomputer 10 starts the processing shown in the flowchart of FIG. 2, when a supply of an internal electric power to the microcomputer 10 is started.

At S10, the process maintains a power supply to the microcomputer 10. That is, when an internal electric power is supplied from the power controller 20 to the microcomputer 10 at timing t11, as shown in FIG. 3, the microcomputer 10 outputs the 5V request signal to the power controller 20 at timing t12, and maintains a supply of the internal electric power to the microcomputer 10 itself. In other words, when the ignition switch IGSW is turned from OFF to ON, the operation of the load driver 100 is enabled by the generation of an internal electric power by the power controller 20 and the supply of the generated internal electric power to the microcomputer 10. After turning ON the ignition switch IGSW, the backup battery device 420 performs a supply of electric power to the load driver 100.

With reference again to FIG. 2, at S20, the first relay 210 is turned ON, and the second relay 220 is turned OFF. As shown in FIG. 3 at timing t13, the microcomputer 10 turns the first relay 210 from OFF to ON by outputting the Lo drive signal. At such timing, the microcomputer 10 keeps the second relay 220 OFF by outputting the HI permission signal. That is, the microcomputer 10 turns ON the first relay 210 without turning ON the second relay 220 (i.e., keeping the second relay 220 to stay OFF). The load driver 100 supplies electric power to the motor 300 via the first relay 210 at a normal time, i.e., when the accessory battery 410 is in a normal state. The load driver 100 will put the parking lock mechanism into a lock state by driving the motor 300 under the control of the microcomputer 10, upon receiving an input of a lock instruction signal while the electric power is being supplied to the motor 300 via the first relay 210.

With reference again to FIG. 2, at S30, it is determined whether the accessory battery 410 is normal. The microcomputer 10 determines whether the accessory battery 410 is in a normal state based on the accessory battery voltage measured by the first monitor 31. Then, the microcomputer 10 continues to measure the accessory battery voltage at S30 when the accessory battery 410 is in a normal state, and, the process proceeds to S40 when it is determined that the accessory battery 410 is not in a normal state.

The time chart of FIG. 3 illustrates a situation where there is a loss of electric power from the accessory battery 410 at timing t14. In this case, it is determined by the microcomputer 10 that the accessory battery 410 is in a normal state from timing t13 to timing t15. Then, the microcomputer 10 determines that the accessory battery 410 is not in a normal state at timing t15, that is, when the voltage from the first monitor 31 falls to be less than a threshold voltage value.

With reference to FIG. 2, at S40, while turning OFF the first relay 210, the second relay 220 is turned ON. As shown in FIG. 3 at timing t15, the microcomputer 10 turns the first relay 210 from ON to OFF by outputting the Hi drive signal. That is, upon detecting a loss of the electric power supply function of the accessory battery 410, the microcomputer 10 releases a prohibition by the third switching element T3 while putting the first relay 210 in an open state by outputting the Hi drive signal.

As shown in FIG. 3 at timing t16, the microcomputer 10 turns the second relay 220 from OFF to ON by outputting the Lo permission signal. That is, the microcomputer 10 outputs the Lo permission signal, in order to switch the supply of electric power from the accessory battery 410 to the backup battery device 420, to supply the motor 300 with electric power via the second relay 220. In such manner, even when the accessory battery 410 loses the electric power supply function, the load driver 100 can continue to drive the motor 300 (i.e., motor remains in a drivable state) by switching the power supply from the accessory battery 410 to the backup battery device 420.

In order for the microcomputer 10 to avoid simultaneously turning ON the first relay 210 and the second relay 220, the microcomputer 10 turns ON the second relay 220 after waiting for the first relay 210 to be turned OFF. A predetermined period of time for the first relay 210 to be turned OFF after a drive signal switches from Lo to Hi (i.e., an OFF time) is set in advance. That is, after the drive signal switches from Lo to Hi, a predetermined amount of time may lapse before the first relay 210 is turned OFF. Therefore, the microcomputer 10 measures the time after outputting Hi as the drive signal based on a value obtained from a timer or the like. Then, the microcomputer 10 confirms that the measured time has exceeded the OFF time, and turns the second relay 220 from OFF to ON. In such manner, the load driver 100 can prevent simultaneously turning ON the first relay 210 and the second relay 220.

The load driver 100 can supply electric power from the backup battery device 420 to the motor 300 via the second relay 220 instead of supplying electric power from the accessory battery 410 and the first relay 210, even when the accessory battery 410 is in an abnormal state. Therefore, the microcomputer 10 will drive the motor 300 and the load driver 100 can change a parking lock mechanism to the locked state if a lock instruction signal is input when a power supply to the motor 300 is being supplied via the second relay 220. Thus, the load driver 100 will put the parking lock mechanism into a locked state by using the microcomputer 10 to control the drive of the motor 300, when the microcomputer 10 receives a lock instruction signal while electric power is being supplied to the motor 300 via the second relay 220. In such manner, even when the accessory battery 410 is in an abnormal state, the load driver 100 can put the parking lock mechanism into the lock state, i.e., can stop the vehicle. Therefore, the second relay 220 can be considered as a backup relay.

With reference to FIG. 2, at S50, the user receives a notice. That is, the microcomputer 10 provides a notice to the user regarding an abnormal state of the accessory battery 410, i.e. an accessory battery malfunction or abnormality. The microcomputer 10 may provide the notice to the user about the abnormality via, for example, the CAN I/F 60 and by using a display device connected to the other node 600. However, in the present disclosure, S50 may not necessarily be performed, or a different process may be performed at S50.

With reference to FIG. 4 an operation of the load driver 100 in a simultaneous ON occurrence time is described. In a situation that, after turning ON the first relay 210 as shown at timing t17, in trying to turn ON the second relay 220 instead of turning ON the first relay 210, an output of the Hi drive signal from the load driver 100 to turn ON the second relay 220 may actually adhere to Lo. In such case, the load driver 100 outputs the Lo permission signal at time t18, and the second switching element T2 is turned ON. That is, the load driver 100 simultaneously outputs both of a Lo drive signal and a Lo permission signal between times t18-t19.

However, the load driver 100 can turn ON the third switching element T3 by using a drive signal, even after both of the drive signal and the permission signal are output as Lo. Therefore, the load driver 100 can bring the gate voltage level of the fifth switching element T5 to the ground level by turning ON the third switching element T3. Therefore, the load driver 100 can continue the OFF state of the second relay 220.

In such case, the load driver 100 may detect and provide an abnormality notice to the user about (i) a continuation of the OFF state of the second relay 220 at a timing that would normally be an ON time of the second relay 220, and (ii) a continuation of the ON state of the first relay 210. The abnormality notice to the user may include an instruction to restart the vehicle, that is, first turning OFF the vehicle (i.e., turning the ignition switch IGSW to OFF) and then turning ON the vehicle (i.e., turning the ignition switch IGSW to ON) again. In such manner, by rebooting, the load driver 100 may return to a normal state.

The load driver 100 receives a voltage supply to a port that is connected to the driver 50 when each of the relays 210 and 220 is turned ON and OFF. Therefore, the load driver 100 is enabled to recognize whether each of the relays 210 and 220 is in the ON state or in the OFF state by detecting such a supply of voltage to the port that is connected to the driver 50. In the above example, the load driver 100 can detect the continuation of the ON state of the first relay 210, based on the continuation of the voltage supply to the port, in a situation in which the first relay 210 should have been turned OFF but continues to supply voltage to the port.

The load driver 100 may turn ON the second relay 220 not only when the accessory battery 410 is in an abnormal state, but also when confirming/testing an operation the second relay 220. Adherence to the Lo drive signal may also be designated as an ON failure of the first switching element T1.

Thus, as described above, the load driver 100 is provided with the third switching element T3 that prohibits the turning ON of the second relay 220 when the open-close control signal that instructs the first relay 210 to switch ON is output. Therefore, the load driver 100 can limit and/or prevent the simultaneous ON state of both the first relay 210 and the second relay 220. Since the load driver 100 can limit and/or prevent the simultaneous ON state of both relays 210 and 220 without having a diode or like component connected to an upstream position of the first relay 210 and the second relay 220, an increase to the number of ports or wire harnesses to accommodate the additional components can be limited and/or prevented. Since use of the load driver 100 allows for a lesser number of wire harnesses to be used, material weight increases to the vehicle and material cost increases can be better limited and controlled.

The load driver 100 may possibly have a short circuit between the backup battery device 420 and the accessory battery 410, if both of the relays 210 and 220 are simultaneously turned ON. However, since the load driver 100 can prevent the simultaneous turn ON of both relays 210 and 220, such a short circuit between the backup battery device 420 and the accessory battery 410 may be limited and/or prevented.

When the load driver 100 is put in a state in which the accessory battery 410 is short-circuited to the ground causing a short-circuit state between the accessory battery 410 and the backup battery device 420, an electric current may possibly flow from the backup battery device 420 via both of the relays 210 and 220. In such a case, the load driver 100 may lose the supply of electric power to the motor 300. However, since the load driver 100 can prevent the simultaneous turn ON of both of the relays 210 and 220, such a loss of the power supply to the motor 300 may be limited and/or prevented.

By using the load driver 100, an increase to the number of additional diodes and wiring to the diodes can be limited and/or prevented, thereby limiting and/or preventing voltage drops at the diodes. Therefore, the load driver 100 can limit and/or prevent the decrease of the drivable voltage range that may otherwise be caused by the voltage drop. That is, the load driver 100 can solve the problem caused by configurations in which the voltage range is decreased due to the use of additional diodes.

Although the present disclosure has been fully described in connection with embodiment with reference to the accompanying drawings, it is to be noted that various changes and modifications will become apparent to those skilled in the art, and such changes, modifications, and summarized schemes are to be understood as being within the scope of the present disclosure as defined by appended claims.

What is claimed is:

1. A load driver for driving a load configured to receive an electric power supply from a first power supply or from a second power supply, the load driver having a first relay disposed at a position between the first power supply and the load and a second relay disposed at a position between the second power supply and the load, the load driver comprising:
   a controller configured to control an open state and a closed state of the first relay and the second relay by an open-close control signal;
   a first open-close switch configured to control driving the first relay to the open state and the closed state based on the open-close control signal from the controller;
   a second open-close switch configured to control driving the second relay to the open state and the closed state based on the open-close control signal from the controller; and
   a prohibition switch configured to prohibit driving the second relay to the closed state, when the controller outputs the open-close control signal to drive the first relay to the closed state to supply electric power from the first power supply to the load via the first relay.

2. The load driver of claim 1, wherein
the controller is configured to receive an electric power supply from the first power supply or from the second power supply.

3. The load driver of claim 1, wherein
when a power supply function of the first power supply is lost, the controller outputs the open-close control signal to drive the first relay to the open state and releases the prohibition switch to drive the second relay, and wherein
the controller outputs the open-close control signal to drive the second relay to the closed state to supply electric power from the second power supply to the load via the second relay.

4. The load driver of claim 3 further comprising:
a monitor circuit configured to monitor a voltage of the first power supply, wherein
the controller determines whether the power supply function of the first power supply is lost based on the voltage monitored by the monitor circuit.

5. The load driver of claim 4, wherein
the controller includes an analog-digital (AD) conversion circuit that performs an AD conversion of the voltage monitored by the monitor circuit.

6. The load driver of claim 1, wherein
the controller is further configured to communicate with the second power supply.

7. The load driver of claim 6, wherein
the second power supply is further configured to output a start signal that starts an operation of the controller from a stop state without receiving a supply of electric power, and
the operation of the controller from the stop state is started upon receiving an input of the start signal from the second power supply.

8. The load driver of claim 1, wherein
the second open-close switch is a MOSFET driven by an input of a signal to a gate terminal, and
the prohibition switch is a transistor that prohibits the MOSTFET from driving the second relay to the closed state by grounding a potential of the gate terminal when the controller outputs the open-close control signal to drive the first relay to the closed state.

9. The load driver of claim 1, wherein
the load is an electromotor that switches a parking lock mechanism in a vehicle between a lock state and an unlock state, and
the controller outputs an instruction signal to the electromotor to switch the parking lock mechanism between the lock state and the unlock state.

10. The load driver of claim 1, wherein
the controller is a microcomputer that is configured to output the open-close control signal to selectively control the open state and the closed state of the first relay and the second relay.

11. The load driver of claim 10, wherein
the microcomputer controls the prohibition switch to prevent the second relay from being in the closed state in response to the first relay switch being in the closed state to ensure that both the first relay and the second relay are not simultaneously in the closed state.

* * * * *